US006341962B1

(12) United States Patent
Sinclair

(10) Patent No.: US 6,341,962 B1
(45) Date of Patent: Jan. 29, 2002

(54) SOLDERLESS GRID ARRAY CONNECTOR

(75) Inventor: William Y. Sinclair, Frenchtown, NJ (US)

(73) Assignee: Aries Electronics, Inc., Frenchtown, NJ (US)

( * ) Notice: Subject to any disclaimer, the term of this patent is extended or adjusted under 35 U.S.C. 154(b) by 0 days.

(21) Appl. No.: 09/696,506

(22) Filed: Oct. 25, 2000

Related U.S. Application Data
(60) Provisional application No. 60/163,048, filed on Oct. 29, 1999.

(51) Int. Cl.$^7$ .............................................. H01R 12/00
(52) U.S. Cl. ............................................ 439/66; 439/71
(58) Field of Search .............................. 439/66, 70, 71

(56) References Cited

U.S. PATENT DOCUMENTS

| | | | | | |
|---|---|---|---|---|---|
| 4,858,074 | A | * | 8/1989 | Mallet et al. | 361/388 |
| 5,791,914 | A | * | 8/1998 | Loranger et al. | 439/71 |
| 6,043,666 | A | * | 3/2000 | Kazama | 324/754 |
| 6,174,174 | B1 | * | 1/2001 | Suzuki et al. | 439/71 |

FOREIGN PATENT DOCUMENTS

| JP | 07161416 | * | 6/1995 | H01R/23/68 |
|---|---|---|---|---|

* cited by examiner

*Primary Examiner*—Tulsidas Patel
(74) *Attorney, Agent, or Firm*—Anthony J. Casella; Gerald E. Hespos

(57) ABSTRACT

A connector assembly is provided for solderlessly connecting an integrated circuit package to a printed circuit board. In the first embodiment of the invention, a plurality of generally cylindrical resilient electrical contacts are disposed in through holes formed in a non-conductive substrate. The contacts are formed from a single conductor that is coiled in a helical fashion to form a contact which resembles a spring. Each spring-like contact is formed to begin with an annular rim defining a contact point. The conductor is then coiled in such a manner to form diametrically equal rings which are spaced equidistant apart. The spring-like contact is then concluded with a similar annular rim as to the beginning contact point. An intermediate portion equidistant from beginning and concluding rims is formed so that a small portion of coiled turns have a diameter which is larger than the other diameters defined by the annular rim. The enlarged intermediate portion of the spring-like contact engages the inner surface of the through holes in an interference fit. The beginning annular rim defines a contact point for receiving and electrically engaging a ball lead or land of a grid array package, while the concluding rim is for engagement with an underlying printed circuit board or semi-conductor device. Additionally, as a second embodiment, a resilient electrical contact formed from spring to resemble two cones joined at their bases is provided within each of the through holes.

5 Claims, 3 Drawing Sheets

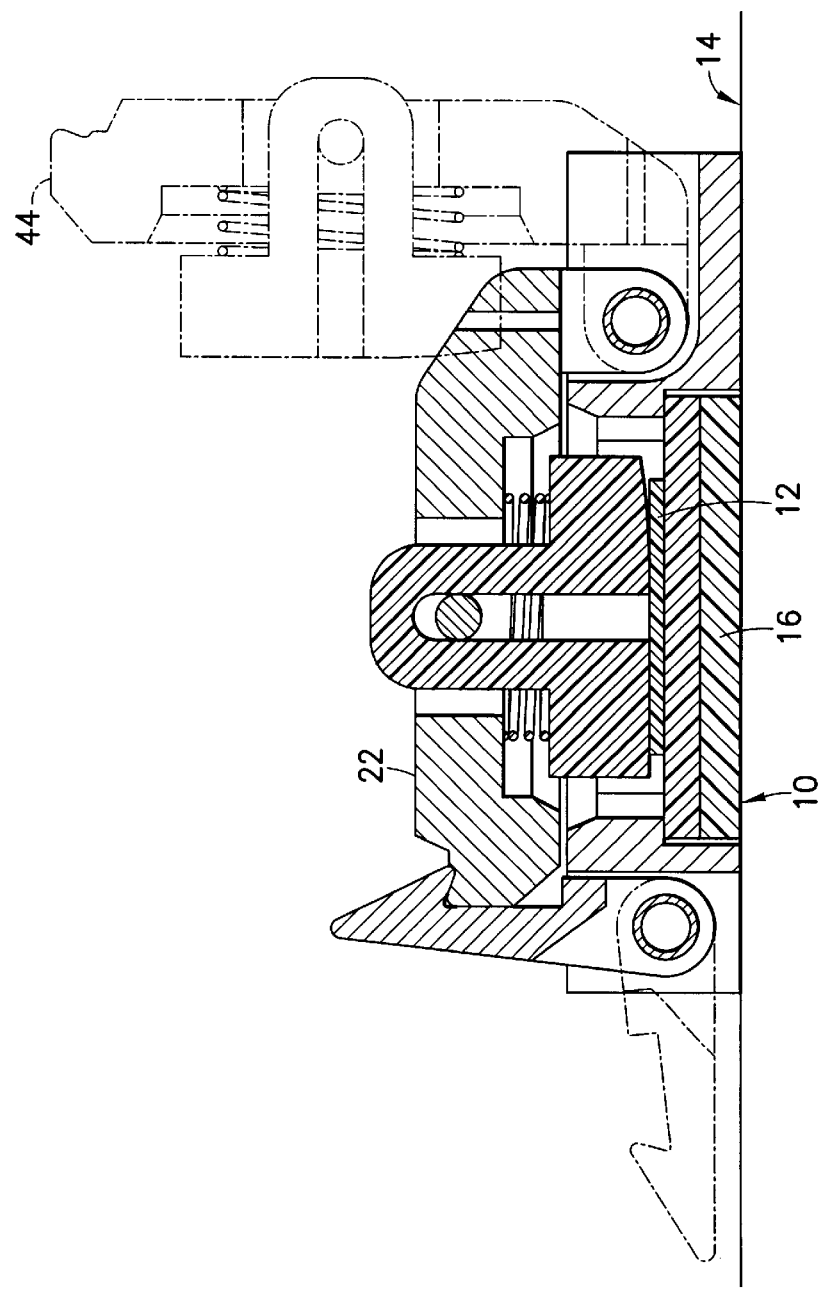
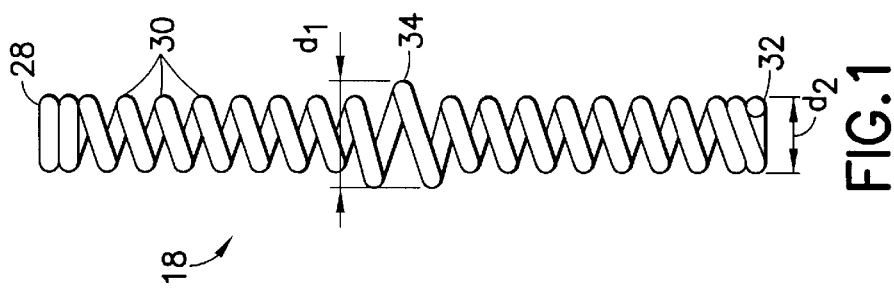
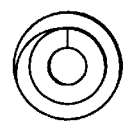

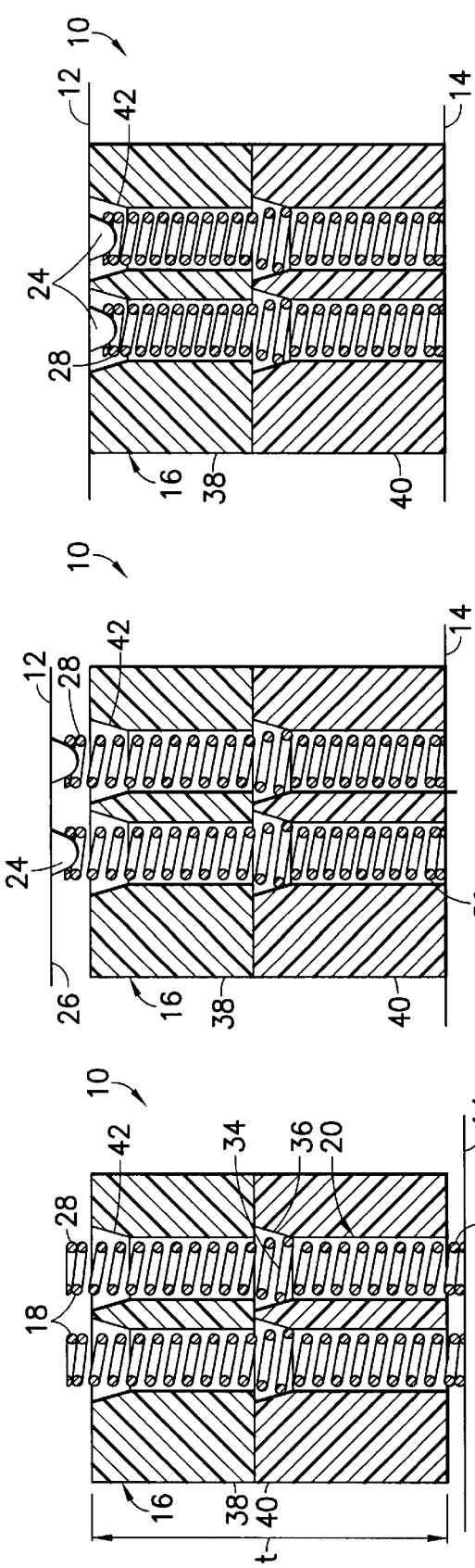

SOLDERLESS GRID ARRAY CONNECTOR

This application claims priority of U.S. Provisional Application Ser. No. 60/163,048, filed Oct. 29, 1999.

BACKGROUND OF THE INVENTION

1. Field of the Invention. The subject invention relates to connectors for connecting integrated circuit packages to printed circuit boards, and more specifically, a connector for establishing solderless connections between the leads of an integrated circuit package and a printed circuit board.

2. Description of the Prior Art. Integrated circuits are typically housed within a package which is designed to protect the integrated circuit from damage, provide adequate heat dissipation during operation, and provide electrical connection between the integrated circuit and the leads of a printed circuit board. Several conventional packages are in the prior art including land grid array (LGA), pin grid array (PGA), ball grid array (BGA), and column grid array (CGA).

In integrated circuit (IC) packages, terminal lands are arranged on one major face of the package in a pattern corresponding with mounting pads, or leads, on the surface of a circuit board or the like. The device package is mounted on the circuit board by soldering the terminal lands to the mounting pads. Packages having a pattern of lands distributed over a major portion of one face thereof are called land grid array (LGA) packages. Similarly, packages having small solder bumps arranged in a pattern on one face for forming interconnections with external circuitry are usually referred to as ball grid array (BGA) packages.

In many applications, the soldering of the leads of the IC package to the printed circuit board is undesirable. For example, it is impossible to visually locate a short or ground between the IC package and printed circuit board. Usually, an expensive X-ray technique is required to inspect the connections since the leads are hidden under the package. Further, the increasing number of leads being provided by IC packages makes the soldering of the packages to printed circuit boards more difficult.

Accordingly, in the prior art, an improved connector has been developed which is designed to eliminate the need for the soldering the leads of an IC package to a printed circuit board. One example of a device which satisfied this criteria is the "fuzz ball" socket. The "fuzz ball" socket comprises a non-conductive substrate formed with a plurality of through holes which each house a contact element. The contact elements are formed by forcing a predetermined length of gold plated wire into a through hole such that the wire will bend haphazardly into a jumbled contact that extends through the through hole and resembles a piece of steel wool. To mount an IC package to a printed circuit board, the "fuzz ball" socket is tightly secured to a printed circuit board and, in turn, the package is tightly secured to the "fuzz ball" socket. It can be appreciated, sufficient pressure must be applied to both the "fuzz ball" socket and the package, respectively, to maintain electrical connections between the lands of the package and the printed circuit board via the "fuzz ball" socket.

As the number of lands and corresponding "fuzz ball" contacts are increased, the pitch between contacts is correspondingly decreased and manufacturing problems increased. The placement of individual wires into evermore tightly packed through holes requires tremendous technological developments. Furthermore, "fuzz ball" sockets are relatively expensive due to costly manufacturing including the placement of individual wires into the through holes to form the various "fuzz ball" contacts. Additionally, the great force required to push the ball leads of a BGA package into contact with the "fuzz ball" socket creates wear on the BGA ball leads and increases the likelihood of distorting the ball leads.

In addition to the need for a socket which requires little or no force during insertion and a large number of contacts as the pitch of these contacts decrease, a connector is desired which employs resilient contacts that work reliably over repeated cycling and extreme temperature fluctuations as is encountered during testing and burn-in. Prior art connectors employing "Y", "pinch" and "fork" contacts satisfy the resiliency requirement necessary for burn-in but will not accommodate the tight tolerances and miniscule features of packages with a 0.5 mm-pitch, such as in chip scale packages (CSP). Alternatively, conductive elastomers have failed since the conductive materials yield after a limited number of cycles and a variation in the planarity of the gird array among different packages results in intermittencies. Furthermore, the elastomers tend to yield when exposed to high temperatures.

To overcome the shortcomings of the prior art, it is an object of the subject invention to provide a connector for solderless connection between an IC package and a printed circuit board.

It is another object of the subject invention to provide a connector which reduces the large amount of pressure required to mount an IC package into a socket.

It is a further object of the subject invention to provide a connector having a unique resilient electrical contact capable of achieving an electrical connection between the contact of a circuit board and a lead of an IC package, regardless of whether the IC package is a BGA or LGA package.

It is still a further object of the subject invention to provide a connector having a unique resilient electrical contact which will not deform a ball lead of a ball gird array (BGA) package.

It is also an object of the subject invention to provide a connector which when mounted to a printed circuit board with an IC package secured thereto, the spacing separating the IC package from the printed circuit board is virtually equal to the thickness of the non-conductive substrate of the connector.

SUMMARY OF THE INVENTION

To meet the above-stated objects, a connector assembly is provided for solderlessly connecting an IC package to a printed circuit board. The connector assembly of the subject invention includes a non-conductive substrate formed with a plurality of through holes, each through hole corresponding to a land of the integrated circuit package. In one embodiment of the invention, a generally cylindrical resilient electric contact is disposed within each of the through holes to form an electrical connection between the corresponding land and the lead of a printed circuit board. Additionally, as a second embodiment, a resilient electrical contact formed from a spring to resemble two cones joined at their bases is provided within each of the through holes.

With respect to the first embodiment, the generally cylindrical resilient electrical contacts are formed from a single unitary conductor. The conductor is coiled in a helical fashion to form a contact which resembles a spring. Each spring-like contact is formed to begin with an annular rim defining a contact point. The conductor is then coiled in such a manner to form diametrically equal rings which are spaced equidistant apart. The spring-like contact is then concluded with a similar annular rim as to the beginning contact point. An intermediate portion equidistant from beginning and concluding rims is formed so that a small portion of coiled turns have a diameter which is larger than the other diameters defined by the annular rim. The enlarged intermediate portion of the spring-like contact engages the inner surface of the through holes in an interference fit. The beginning annular rim defines a contact point for receiving and electrically engaging a ball lead or land of a grid array package, while the concluding rim is for engagement with an underlying printed circuit board or semi-conductor device. The spring like contact may be formed from any known resilient conductive material, such as heat-treated beryllium copper. Preferably, the contact is coated with gold, nickel or the like to assure high flexibility, resiliency and electrical conductivity.

The spring-like contacts are mounted within a substrate consisting of two layers each of which includes through holes having at one end thereof an inverted truncated enlarged portion. When the layers are stacked and the contacts mounted therein, the enlarged intermediate portion of the spring-like contact is captured within the inverted truncated opening. In effect, the enlarged intermediate portion of each contact is captured and non-extensible, whereas the opposite ends thereof are resilient and compressible when the connector is in the operative position.

In an unbiased state, the annular rims of the spring-like contact extend slightly beyond the respective outer surfaces of the non-conductive substrate and the coiled turns are spaced equally apart. During use, the IC package and printed circuit board are respectively placed in tight face-to-face engagement with the non-conductive substrate, thereby, compressing the electrical contacts into the non-conductive substrate. The compressed electrical contacts form electrical connections between the IC package and the printed circuit board. Spring forces reactive to the compression of the electrical contacts, maintain the annular rims of the electrical contacts in tight engagement with the corresponding lands and leads. Also, due to the compression of the electrical contacts, in use, the spacing between the IC package and the printed circuit board is virtually equal to the thickness of the non-conductive substrate. Consequently, the connector and the IC package combination can be advantageously assembled and mounted to substantially encompass the actual sum of the dimensions of the IC package and the connector. With space and volume within a computer being at a premium, dimensional increases added to an assembled, mounted component resulting from the mounting procedure are undesirable.

Due to the characteristics of the contact being a spring, it can be appreciated that, when the connector is utilized, the contact only moves in the vertical direction. As opposed to prior art contacts of the "pinch" type where the contact arms move horizontally to grab a lead, the contact of the subject invention will not be displaced in any horizontal direction. Since the through hole does not need to be oversized for the flexing of contact arms, the through hole of the new and improved connector needs to be only slighter larger than the diameter of the turns of the coils of the contact. Advantageously, this will allow the through holes to be smaller than prior art through holes and will allow the pitch of the through holes to decrease being optimally suited for chip scale packages (CSP).

In the mating of a BGA package, the annular rim contact point of the spring-like contact receives the conductive balls leads without undue pressure, and due to the compatible shapes of the annular rim and spherical ball leads, the likelihood of distorting the ball lead is decreased. Also, due to the flat plane the annular rim is defined in, the spring-like contact is desirable for use with land grid array packages, pad grid array packages and the like. In all cases, the spring-like contact allows electrical connection between the contacts of a circuit board and the leads of an IC package without soldering.

In the second embodiment, the conductor is coiled in a helical fashion similar to the contact described above but each turn is formed with a variable diameter. The conductor begins with an annular rim defining a contact point and is then coiled with diametrically increasing rings until an intermediate point of a predetermined length is reached. The rings will then diametrically decrease until a ring is formed with substantially the same diameter as the beginning annular rim. The completed contact will resemble two mirror image cones connected at their bases. Similarly, to the connector of the first embodiment, the substrate retaining the contacts will be formed with through holes to capture the double-end cone-like contacts. The operation and functionality of this embodiment is similar to that described above with respect to the first embodiment.

These and other features of the invention will be better understood through a study of the following detailed description of the invention and the accompanying drawings.

BRIEF DESCRIPTION OF THE DRAWINGS

FIG. 1 is a side view of the spring-like contact of the first embodiment of the subject invention.

FIG. 2 is a top plan view of the contact of the first embodiment of the subject invention.

FIG. 3 is a cross-sectional view of a chip scale package burn-in socket employing the connector of the first embodiment of the subject invention.

FIG. 4 is a cross-sectional view of a contact captured between the two layers of the non-conductive substrate of the first embodiment of the subject invention.

FIG. 5 is a cross-sectional view of the connector of the first embodiment of the subject invention where the connector is mounted to a printed circuit board and the contact is at rest.

FIG. 6 is a cross-sectional view of the connector of the first embodiment of the subject invention where the IC package is fully inserted into the connector.

DETAILED DESCRIPTION OF THE PREFERRED EMBODIMENTS

Figure 9:
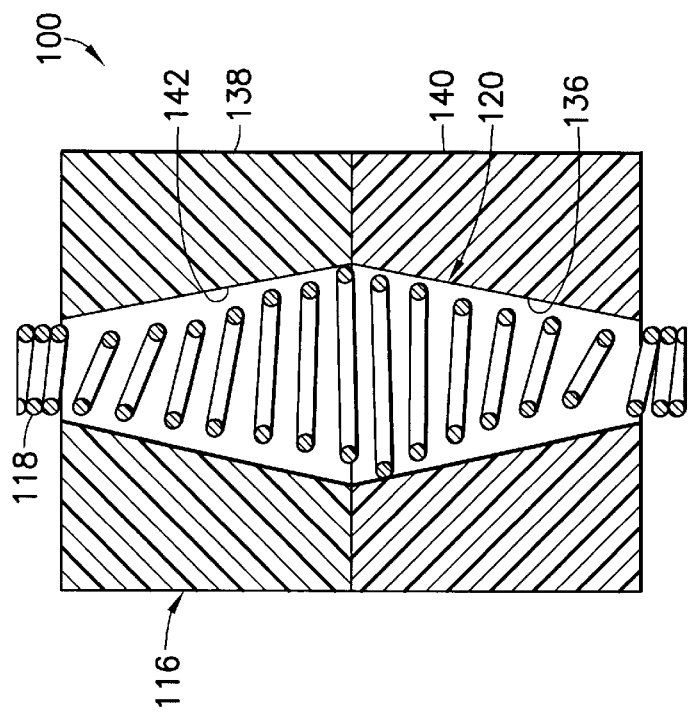
FIG. 9 is a cross-sectional view of a contact captured between the two layers of the non-conductive substrate in accordance with the second embodiment of the subject invention.

Referring to the FIGS., a new and improved connector 10 is provided for connecting an IC package 12 to a printed circuit board 14. The connector 10 includes a non-conductive substrate 16 with a plurality of electrical contacts 18 mounted in through holes 20 formed through the substrate 16. The number of the electrical contacts 18 will generally correspond to the number of lands provided with the circuit 12. Also, the size of the connector 10 is also generally dependent on the size of the integrated circuit 12. The connector 10 may be formed as a socket for accommodating the circuit 12. For purposes of illustration, the connector 10 of the subject invention will be shown and described in connecting a ball gird array (BGA) 12 package to a chip scale package (CSP) burn-in socket 22 as shown in FIG. 3.

It should be noted that the connector 10 need not be formed with the same dimensions as the integrated circuit 12 for purposes of this invention. However, the electrical contacts 18 must be disposed in the connector 10 such that pressing contact is achieved between the electrical contacts 18 and the lands 24 of the integrated circuit 12 with the connector 10 being placed in face-to-face contact with the integrated circuit 12. The lands 24 may be disposed to define a plurality of rows and columns throughout the surface 26 of the integrated circuit 12. Consequently, although not shown, the electrical contacts 18 are to be aligned in a similar row-column pattern.

Referring to FIG. 1 and 4, the first embodiment of the electrical contact 18 is shown. The electrical contact 18 is generally cylindrically shaped with an overall length greater than the thickness "t" of the substrate 16. Each of the electrical contacts 18 is formed from material having good spring characteristics, such as beryllium copper, which permits resilient contraction of the electrical contacts 18 relative to the substrate 16. The generally cylindrical resilient electrical contacts 18 are formed from a single unitary conductor. The conductor is coiled in a helical fashion to form a contact which resembles a spring. Each spring-like contact 18 is formed to begin with an annular rim 28 defining a contact point. The conductor is then coiled in such a manner to form diametrically equal rings 30 which are spaced equidistant apart. The spring-like contact 18 is then concluded with a similar annular rim 32 as to the beginning contact point 28. An intermediate portion 34 equidistant from beginning 28 and concluding 32 rims is formed so that a small portion of coiled turns have a diameter, d 1, which is larger than the other diameters, d2, defined by the annular rim. The enlarged intermediate portion 34 of the spring-like contact 18 engages the inner surface 36 of the through holes 20 of the substrate 16 in an interference fit to retain the contact 18, which will be described in more detail below. The beginning annular rim 28 defines a contact point for receiving and electrically engaging a ball lead 24 or land of an grid array package, while the concluding rim 32 is for engagement with an underlying printed circuit board 14 or semi-conductor device.

The spring-like contacts 18 are mounted within a substrate 16 consisting of two layers 38,40 each of which includes through holes 20 having at one end thereof an inverted truncated enlarged portion 36,42. When the layers 38, 40 are stacked and the contacts 18 mounted therein, the enlarged intermediate portion 34 of the spring-like contact 18 is captured within the inverted truncated opening 36. In effect, the enlarged intermediate portion 34 of each contact 18 is captured and non-extensible, whereas the opposite ends 28, 32 thereof are independently resilient and compressible when the connector 10 is in the operative position.

As shown in FIG. 4 with the connector 10 in an unbiased state, the annular rims 28,32 of the spring-like contact 18 extend slightly beyond the respective outer surfaces of the non-conductive substrate 16 and the coiled turns 30 are spaced equally apart. Turning to FIG. 5, the connector 10 is mounted to the printed circuit board 14. Since the spring-like contact 18 is captured by the inverted truncated portion 36 of the substrate 16, each half of the contact 18 moves independent of each other. When the connector 10 is secured to the printed circuit board 14, the concluding annular rim 32 of the contact 18 makes a gas-tight seal with the board 14 and all but one of the coiled turns 30 come into contact with each other. This seal between the concluding annular rim 32 and the circuit board 14 is not broken every time the IC package is changed, and therefore, once tested, it becomes a very reliable electrical connection.

During use as shown in FIGS. 5 and 6, the ball leads 24 of the BGA package 12 come into contact with the beginning annular rim 28 of the spring-like contact 18. As pressure is applied to the IC package 12 by closing the lid 44 of the clam-shell type burn-in socket 22, the IC package 12 and printed circuit board 14 are respectively placed in tight face-to-face engagement with the non-conductive substrate 16, thereby, compressing the electrical contacts 18 into the non-conductive substrate. As shown in the FIGS. in the situation employing a BGA package, the enlarged truncated portion 42 of the upper layer 38 of the substrate 16 allows the ball leads 24 to sit within the through hole 20. Similarly as described above with respect to the lower portion of the contact, the upper coiled turns 30 of the contact 18 will come into contact with each. The compressed electrical contacts 18 form electrical connections between the IC package 12 and the printed circuit board 14. Spring forces reactive to the compression of the electrical contacts 18 maintain the annular rims of the electrical contacts in tight engagement with the corresponding lands and leads.

The connector 10 cannot only be used as a socket but also as an interconnector or interposer between stacked integrated circuits. In use, the connector 10 is interposed between two integrated circuits, and the entire assembly is fastened together with the surfaces of the connector being in tight face-to-face engagement with the surfaces of the adjoining integrated circuits. Due to the resiliency of the electrical contacts 18, the electrical contacts 18 cannot be permanently deformed during use, as the above-described prior art "fuzz ball socket". Additionally, it should be noted that the height of the spring-like contact 18 is determined so that during full compression of the contact not all of the coiled turns 30 come into contact with each other, thus avoiding mechanical failure of the contact 18. Also, since the electrical contacts 14 can be fully compressed into the substrate 12 of the connector 10, the spacing between an assembled stack of integrated circuits is equal to the thickness of the substrate 12.

Figure 7:
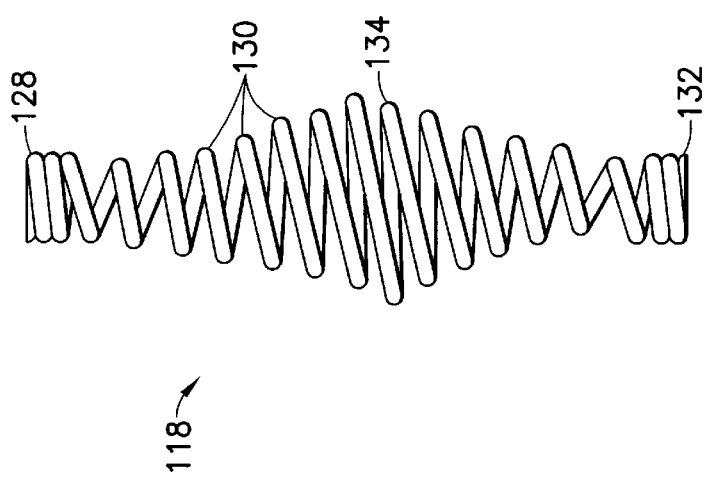
FIG. 7 is a side view of the spring-like contact of the second embodiment of the subject invention.
Figure 8:
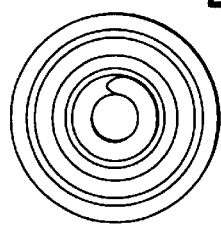
FIG. 8 is a top plan view of the contact of the second embodiment of the subject invention.

Referring to FIGS. 7–9, a second embodiment of the invention is shown which is directed to a connector 100 which includes an electrical contact 118. The connector 100 includes a non-conductive substrate 116 which has a plurality of through holes 120 formed therethrough. The connector 100 is intended for the same uses as described above with respect to the connector 10 and, the comments regarding the number and orientation of the through holes 20 discussed above with respect to the non-conductive substrate 16 apply equally here, as well as the discussion regarding the overall dimensioning of the non-conductive substrate 16. Also, the integrated circuit 12 may be fastened to the connector 100 in similar methods as described above with respect to the connector 10.

As can be seen from FIG. 7, the conductor 118 is coiled in a helical fashion similar to the contact described above but each turn is formed with a variable diameter. The conductor begins with an annular rim 128 defining a contact point and is then coiled with diametrically increasing rings until an intermediate point 134 of a predetermined length is reached. The rings will then diametrically decrease until a ring 132 is formed with substantially the same diameter as the beginning annular rim. The completed contact will resemble two mirror image cones connected at their bases.

Similarly, to the connector 10 of the first embodiment, the substrate 116 retaining the contacts 118 will be formed with through holes 120 to capture the double-end cone-like contacts 118. Each layer 138,140 of the substrate 116 is formed with a truncated cone shaped through holes 136, 142. The two layers 138,140 are then disposed in opposite orientations such that the through holes 120 are symmetrically formed about the plane of engagement formed between the two layers. The operation and functionality of this embodiment is similar to that described above with respect to the first embodiment.

As is readily apparent, numerous modifications and changes may readily occur to those skilled in the art, and hence it is not desired to limit the invention to the exact construction and operation shown and described. Accordingly, all suitable modification equivalents may be resorted to falling within the scope of the invention as claimed.

What is claimed is:

1. A connector assembly for forming a plurality of electrical connections between an integrated circuit package and a printed circuit board, said connector assembly comprising:

a non-conductive substrate having opposed top and bottom surfaces and a plurality of annular through holes extending between said top and bottom surfaces, each said through hole having an enlarged diameter portion intermediate said top and bottom surfaces; and a plurality of generally cylindrical resilient electrical contacts corresponding to said plurality of through holes, each said electrical contact being disposed in a single said through hole, each said electrical contact being formed from a single uniformly sized conductor coiled in a helical fashion, having an upper portion, a lower portion and an intermediate portion, said upper and lower portions of the electrical contact comprising a plurality of spaced coils being of the same diameter, while the intermediate portion of said electrical contact is of a greater diameter for capture in the enlarged diameter portion of the substrate so as to be non-extensible whereas the upper and lower portions of the electrical contact are independently resilient and compressible when the connector assembly is in the operative position.

2. A connector assembly as in claim 1, wherein said first end extends through said top surface of said substrate and is compressible in a direction generally normal to said substrate.

3. A connector assembly as in claim 2, wherein said second end extends through said bottom surface of said substrate and is compressible in a direction generally normal to said substrate.

4. A connector assembly as in claim 3, wherein said non-conductive substrate is formed from at least two layers, each said layer having opposing top and bottom surfaces.

5. A connector assembly as in claim 4, wherein said through holes of each said layer has an enlarged truncated portion adjacent to said top surface whereby said intermediate portion of said contact is captured in said truncated portion of said bottom layer.

* * * * *